US007515399B2

(12) United States Patent
Kriegesmann et al.

(10) Patent No.: US 7,515,399 B2
(45) Date of Patent: Apr. 7, 2009

(54) DEVICE FOR CURRENT DISTRIBUTION

(75) Inventors: Stephan Kriegesmann, Dortmund (DE); Michael Beck, Remscheid (DE); Hermann Bommersheim, Solingen (DE); Volker Helbig, Erkelenz (DE); Alfred Sadrinna, Hagen (DE); Gregor Storsberg, Solingen (DE)

(73) Assignee: Leoni Bordnetz-Systeme GmbH, Nuremberg (DE)

( * ) Notice: Subject to any disclaimer, the term of this patent is extended or adjusted under 35 U.S.C. 154(b) by 9 days.

(21) Appl. No.: 11/713,819

(22) Filed: Mar. 2, 2007

(65) Prior Publication Data

US 2007/0263344 A1 Nov. 15, 2007

(30) Foreign Application Priority Data

Mar. 4, 2006 (DE) ....................... 10 2006 010 071

(51) Int. Cl.
*H02B 1/18* (2006.01)
*H02B 1/26* (2006.01)
*H05K 7/00* (2006.01)
*H01H 85/02* (2006.01)

(52) U.S. Cl. ....................... 361/630; 361/640; 361/626; 361/760; 361/638; 337/198

(58) Field of Classification Search ................. 361/630, 361/640, 626, 760, 638; 337/198
See application file for complete search history.

(56) References Cited

U.S. PATENT DOCUMENTS 4,555,638 A * 11/1985 Lobe ......................... 307/10.1
4,687,270 A * 8/1987 Plyler et al. ................. 439/350
4,806,118 A * 2/1989 Herrmann .................... 439/352
4,846,733 A * 7/1989 Baisz et al. ............ 439/620.33
5,112,242 A * 5/1992 Choy et al. ................. 439/326
5,631,620 A * 5/1997 Totsuka et al. .............. 337/260
5,795,193 A * 8/1998 Yang ..................... 439/620.27
5,823,798 A * 10/1998 Zintler et al. .............. 439/76.2
5,831,814 A * 11/1998 Hamill ....................... 361/627
5,980,302 A * 11/1999 Saka .......................... 439/404
6,215,636 B1 * 4/2001 Hellemans .................. 361/104
6,280,253 B1 * 8/2001 Kraus et al. ............ 439/620.27
6,322,376 B1 * 11/2001 Jetton ........................ 439/76.2
6,707,369 B2 * 3/2004 Morimoto et al. ........... 337/189
6,716,065 B1 * 4/2004 Brooks .................. 439/620.27
6,759,938 B2 * 7/2004 Matsumura et al. ......... 337/161
6,815,841 B1 * 11/2004 Brown et al. ............... 307/10.1
6,878,004 B2 * 4/2005 Oh ............................ 439/250

* cited by examiner

*Primary Examiner*—Jayprakash N Gandhi
*Assistant Examiner*—Bradley H Thomas
(74) *Attorney, Agent, or Firm*—Laurence A. Greenberg; Werner H. Stemer; Ralph E. Locher

(57) ABSTRACT

In order to render possible a compact means for power distribution and fuse protection on the basis of a printed circuit board, the apparatus has a multiple fuse arrangement which comprises a plurality of fuses and is connected to a plurality of output contacts. Furthermore, a printed circuit board is provided, which has a feed plate, which is connected to the multiple fuse arrangement, in particular by means of plug-in contact elements, arranged on one of its sides. The output contacts are arranged on that side of the printed circuit board which is opposite the feed plate.

13 Claims, 6 Drawing Sheets

DEVICE FOR CURRENT DISTRIBUTION

CROSS-REFERENCE TO RELATED APPLICATION

The instant application claims priority under 35 U.S.C. § 119 to German Patent Application 10 2006 010 071.9, filed Mar. 4, 2006.

BACKGROUND OF THE INVENTION

Field of the Invention

The invention relates to an apparatus for power distribution.

In power distributor systems, which are used in the motor vehicle sector for example, power which is supplied by means of a power supply device is distributed to a plurality of output lines. In the process, comparatively high currents of from several amperes up to 250 amperes occur, these currents being supplied by the generator and by the motor vehicle battery for example. In addition to this power distribution, the output lines each have to be protected against short circuits with the aid of fuses. On account of the restricted space conditions in the motor vehicle sector, it is desirable to arrange the individual components for power distribution and fuse protection in as compact a manner as possible.

SUMMARY OF THE INVENTION

The invention is based on the object of specifying a compact power-distributor and fuse-protection system, particularly for use in a motor vehicle.

According to the invention, the object is achieved by an apparatus for power distribution which has a feed line which is connected to a plurality of output contacts by means of a multiple fuse arrangement which has a plurality of fuses. The individual output lines can be connected to these output contacts. Furthermore, the apparatus comprises a printed circuit board which has the feed line arranged on one of its sides. The feed line is connected to the multiple fuse arrangement at the input end by means of a contact element. The output end of this multiple fuse arrangement is in turn connected to the output contacts which are arranged on that side of the printed circuit board which is opposite the feed line.

In this case, a feed line is understood to be a line by means of which the power which is supplied by means of a power supply device is fed to the multiple fuse arrangement at the input end. At the same time, the feed line also preferably serves to supply power to electrical and electronic components which are arranged on the printed circuit board and is an integral part of the printed circuit board or is connected to said printed circuit board over a large area.

This apparatus provides a compact, space-saving unit which has the two functions of power distribution and fuse protection integrated in it. The space-saving configuration is achieved particularly by the arrangement of the feed line of the contact element opposite the output contacts. In this case, the contact element particularly provides a releasable contact-connection between the feed line and the multiple fuse arrangement.

According to one expedient development, the contact element comprises at least one plug-in contact element which is conductively connected to the feed line. Therefore, a simple plug-in contact-connection is provided in order for the feed line to make contact with the multiple fuse arrangement. The output contacts preferably also form plug-in contacts, in particular plug-in contact tongues, with the result that the output lines can likewise be connected to the multiple fuse arrangement by means of a simple plug-in contact-connection.

The connection to the feed line is preferably made by means of a plurality of plug-in contact elements. In this way, the load on the individual plug-in contact elements is reduced. This configuration is particularly provided when designed for high currents of, for example, >50 A up to 150 A. In this case, the individual plug-in contact elements are, for example, designed for currents of from 30 A to 100 A.

According to one expedient development, provision is made for the feed line to have a bent-up contact lug for forming the plug-in contact element. As an alternative to this, a plug-in socket contact is soldered onto the printed circuit board in the manner of a solder contact.

With a view to a refinement which is as cost-effective as possible, the multiple fuse arrangement is formed by a stamped grid. That is to say, the individual fuses are formed by individual, suitably dimensioned grid webs of the stamped grid.

In this case, the stamped grid expediently has, at the input end, at least one input contact tongue with which it is plugged into the plug-in contact element. Therefore, the stamped grid carries out both the function of fuse protection of the individual output lines and also connection to the feed line and therefore the function of power distribution.

In this case, provision is also expediently made for the stamped grid to form the output contacts at the output end and, for this purpose, to have output contact tongues. The output lines which are to be connected to the multiple fuse arrangement only need to be plugged onto the output contact tongues with the aid of plug-in sockets.

A plurality of or all of the fuses of the multiple fuse arrangement are preferably arranged in a common fuse housing. In this case, the multiple fuse arrangement is a one-piece, integral unit which is connected to the feed line and therefore to the printed circuit board, particularly by a simple plug-in connection.

According to a first alternative, the fuse housing is, in this case, oriented perpendicular to the printed circuit board and parallel to the plug-in contact element. At the same time, the plug-in contact elements make contact with the fuses by means of a connecting element which is bent in a U-shape. In this design variant, the fuse housing is arranged on one side of the printed circuit board together with the plug-in contact elements and the feed line. Only the output contacts are arranged on the opposite side in this design variant.

As an alternative to this refinement, one expedient development provides for the fuse housing to be arranged parallel to the printed circuit board and opposite the feed line. In this case, the fuses are connected to the plug-in contact elements by means of a connecting element which is bent in an L-shape and is led through the printed circuit board. In this design variant, the fuse housing is therefore arranged in a space-saving manner parallel to and beneath the printed circuit board.

According to one expedient refinement, the fuses are connected to the contact element by means of a connecting element with an alternative configuration. In this case, provision is made for the connecting element to have a feed contact element for connecting the power supply line. The apparatus is therefore supplied with power by means of the feed contact element when the power supply line is connected. As a result, the feed contact element supplies power both to the feed plate which is arranged on the printed circuit board and also to the multiple fuse arrangement. In this design variant, the printed circuit board and the components which are arranged on it are supplied with power by means of the feed plate. To be precise, control components, switching components or other electrical or electronic components are preferably arranged on the printed circuit board.

In the alternative design variants, the connecting elements are, in this case, each preferably sections of the stamped grid, with the result that no additional elements are required.

In order, in particular, to also be able to supply high currents without problems, the feed line is formed by a feed plate which is fitted on the printed circuit board. In this design variant, the printed circuit board forms a support plate for the feed plate. As an alternative or in addition to the feed plate, the feed line is formed by at least one conductor track which is integrated in the printed circuit board.

In order to connect the feed line from one side of the printed circuit board to the output contacts which are arranged on the other side of the printed circuit board, the printed circuit board preferably has an aperture through which a connection from the feed line to the output contacts is led. In this case, this connection is particularly likewise a section of the stamped grid and, for example, the connecting element with which the fuses are connected to the plug-in contacts.

As an alternative to this, the connection is preferably led past the side of the printed circuit board.

The end of the connecting element therefore preferably has plug-in contact tongues with which it can be plugged into the plug-in contact elements.

The features and combinations of features cited in the subclaims, some taken individually or in combination with parts of claim 1, are already considered to be inventive. In particular, the feature of claim 1 according to which the output contacts are arranged on that side of the printed circuit board which is opposite the feed line is not absolutely necessary.

Exemplary embodiments of the invention are explained in greater detail below with reference to the figures. In the figures, in each case in schematic and simplified illustrations:

DESCRIPTION OF THE PREFERRED EMBODIMENTS

Figure 1A:
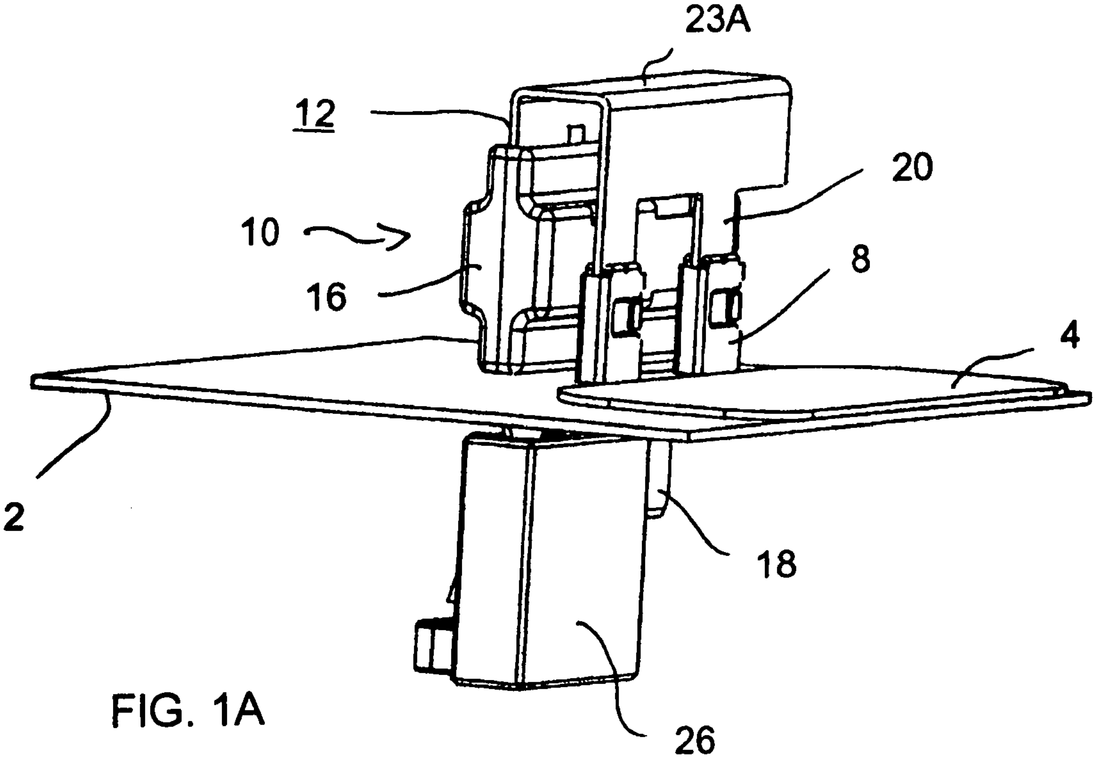
FIGS. 1A, 1B show a perspective illustration and a section illustration of a first design variant with a stamped grid which is bent in a U-shape, in which the fuse housing and the plug-in contact elements are arranged on the upper side of the printed circuit board.

In the figures, parts which act in the same manner are provided with the same reference numerals.

The apparatuses illustrated in the figures form combined power-distribution and fuse-protection systems on the basis of a printed circuit board. They serve, for example, for use in a motor vehicle and, in the installed state, are connected to a power supply line, in particular one originating from the car battery. In the installed state, a plurality of output lines are connected to the output end of the apparatuses in order to supply power to individual component circuits in the motor vehicle.

The power supply line is, for example, directly or indirectly connected to the feed plate 4 by means of a screw contact-making means or another contact-making means (not illustrated in any detail here).

The apparatuses each comprise a printed circuit board 2 (which is illustrated in an only greatly simplified manner) on which a feed line which is in the form of a feed plate 4 is arranged. The feed plate 4 rests on the upper side of the printed circuit board 2 over a large area and is connected to said printed circuit board, in particular also electrically, in order to supply power. The feed plate 4 is connected to a multiple fuse arrangement 10 by means of a plurality of plug-in contact elements 8 in each case. Said multiple fuse arrangement comprises a bent stamped plate 12 in the central fuse region of which a plurality of fuses 14 are formed by corresponding design of the stamped webs. The stamped plate is surrounded by one or more fuse housings 16 in the central fuse region. At the output end, the stamped plate 12 has a plurality of output contact tongues 18 which form output contacts. These output contacts are each protected against short circuits by means of a fuse 14. In the installed state, the output lines for the individual electrical circuits are connected to the output contact tongues 18. At the input end, the stamped plate 12 likewise has a plurality of input contact tongues 20 with which the stamped grid 12 is plugged into the plug-in contact elements 8. The stamped grid 12 is preferably composed of copper, a copper alloy or of zinc with a surface coating based on silver or tin.

In all design variants, the output contact tongues 18 are arranged on the opposite side to the feed plate 4. The power connection from the feed plate 4 to the output contact tongues 18 is therefore led from one side of the printed circuit board to the other side of the printed circuit board. Electrical and electronic functions are usually integrated in the printed circuit board 2 itself in a manner which is not illustrated in any detail here, and the printed circuit board 2 is populated with corresponding electrical or electronic components and has integrated conductor tracks. In this case, the printed circuit board 2 is supplied with power by means of the feed plate 4, that is to say the feed plate 4 serves both for feeding power to the printed circuit board 2 and also for distributing power to the individual output contact tongues 18 of the multiple fuse arrangement 10.

The overall effect of the special design using the multiple fuse arrangement 10 with the stamped grid 12 is a simple and at the same time compact design with which both power distribution and also fuse protection of high currents of, in particular, more than 20 amperes is achieved.

Figure 1B:
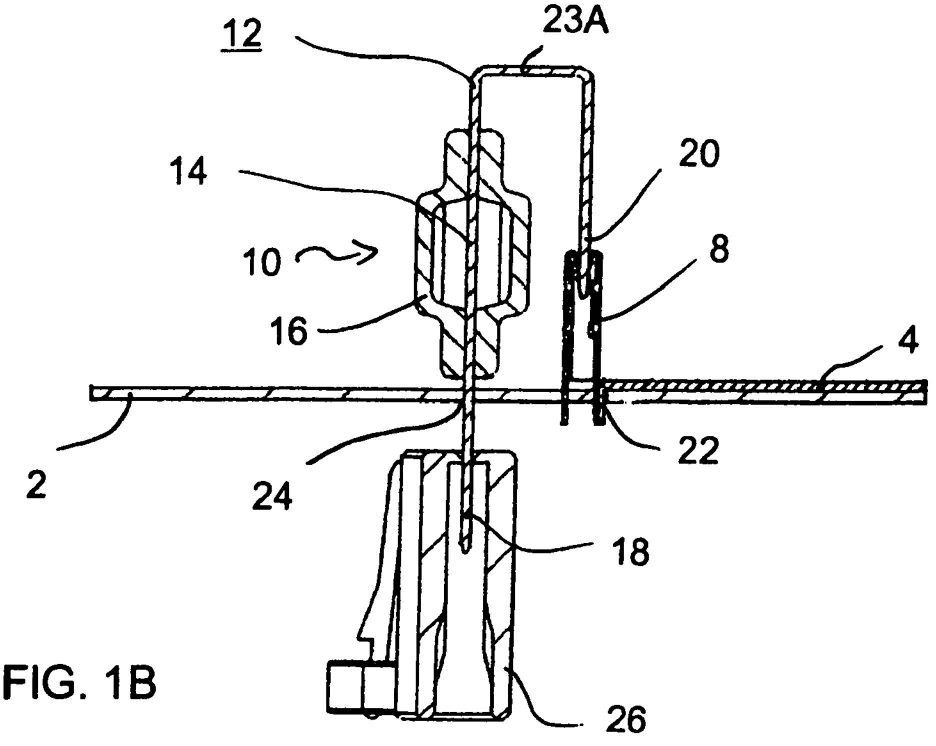

In the exemplary embodiment of FIGS. 1A, 1B, the plug-in contact elements 8 are formed by solder contacts which are soldered onto the printed circuit board 2. To this end, the plug-in contact elements 8 are plugged into the printed circuit board 2. At the same time, a bent-over lug 22 of the feed plate 4 is plugged into the printed circuit board 2 in this region and directly soldered to the plugged-in foot of the plug-in contact element 8. In this case, the plug-in contact elements 8 are oriented perpendicular to the printed circuit board 2, with the result that the input contact tongues 20 are plugged in from above, that is to say perpendicular to the printed circuit board 2. In this case, the plug-in contact elements 8 have contact springs in the upper plug-in region.

The stamped grid 12 which exhibits the output contact tongues 18 is bent in U-shaped manner above the printed circuit board 2 and thus forms a U-shaped connecting element 23A. The fuse region is provided above the printed circuit board 2 on the same side as the feed plate 4. In this case, the fuse housing 16 extends parallel to the plug-in contact elements 8 and likewise perpendicular to the printed circuit board 2 on account of the U-shaped design of the stamped grid 12. The stamped grid 12 is then led through an aperture 24 in the printed circuit board 2, with the result that the output contact tongues 18 are located on the other side of the printed circuit board 2. The exemplary embodiment illustrates an output housing 26 into which the individual output contact tongues 18 issue. The output housing 26 serves to make direct contact with the output contact tongues 18, to be precise the output contact housing 26 forms a kind of connector with internal integrated plug-in contact elements to which the respective output lines are connected. In order to make contact with the output line, the output housing 26 which forms the connector then only needs to be plugged onto the respective output contact tongues 18. In this case, a different output housing 26 and connector are typically provided for different electrical circuits.

In the exemplary embodiment of FIG. 2, the plug-in contact elements 18 are again soldered to the printed circuit board 2. However, in contrast to the exemplary embodiment of FIG. 1, the feed plate 4 is led around the individual plug-in contact elements 8. In this exemplary embodiment, the individual plug-in contact elements do not make direct contact with the individual lugs 22. Instead, contact is made by means of conductor tracks or conductive regions on the printed circuit board 2 which are not illustrated here. As an alternative, the lugs 22 are conductively connected to the plug-in contact elements 8 by means of the solder points not illustrated here.

Furthermore, in contrast to the exemplary embodiment according to FIGS. 1A, 1B, the stamped grid 12 is of step-like or s-shaped design and the input contact tongues 20 are led through the printed circuit board 2 through a plurality of apertures 24 from below and plugged into the individual plug-in contact elements 8. By virtue of the stepped design of the stamped grid 12, a region is formed which runs beneath the printed circuit board 2 and parallel to said printed circuit board and in which the fuse region with the fuse housing 16 is provided. In this exemplary embodiment, the fuse housing 16 is therefore oriented opposite the feed plate 4 and parallel to the printed circuit board 2 and connected to the plug-in contact elements 8 by an approximately L-shaped connecting element 23B.

Figure 2A:
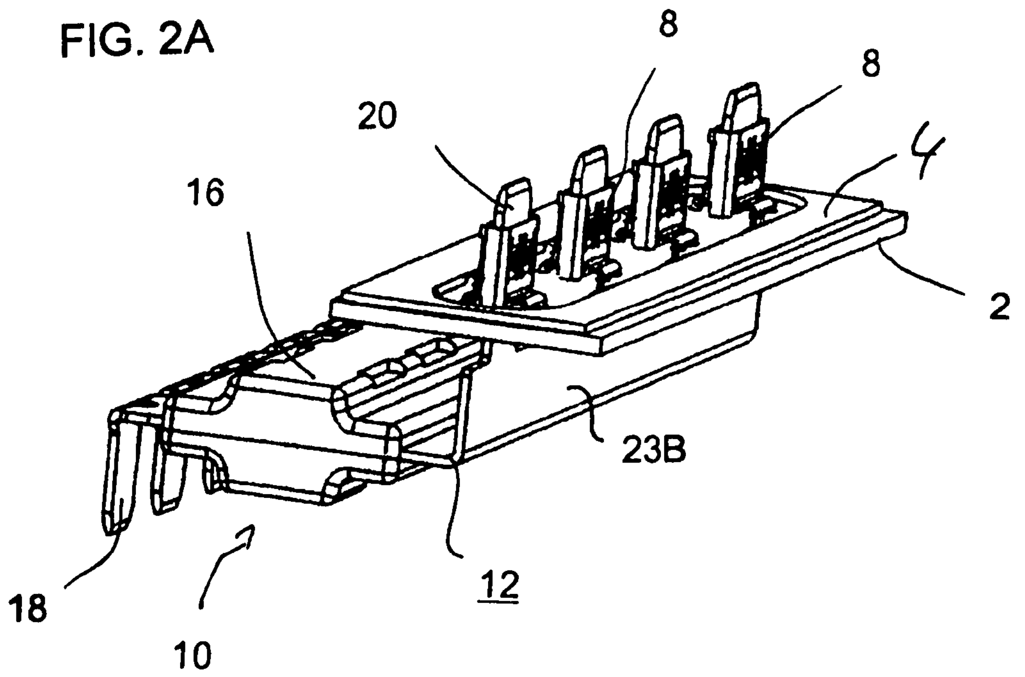
FIGS. 2A, 2B show a perspective illustration and a section illustration of a second design variant with a stamped grid which is bent in an s-shape, in which the plug-in contact elements together with the feed plate are arranged on the upper side of the printed circuit board and the fuse housing is oriented parallel to the printed circuit board and arranged beneath said printed circuit board.
Figure 2B:
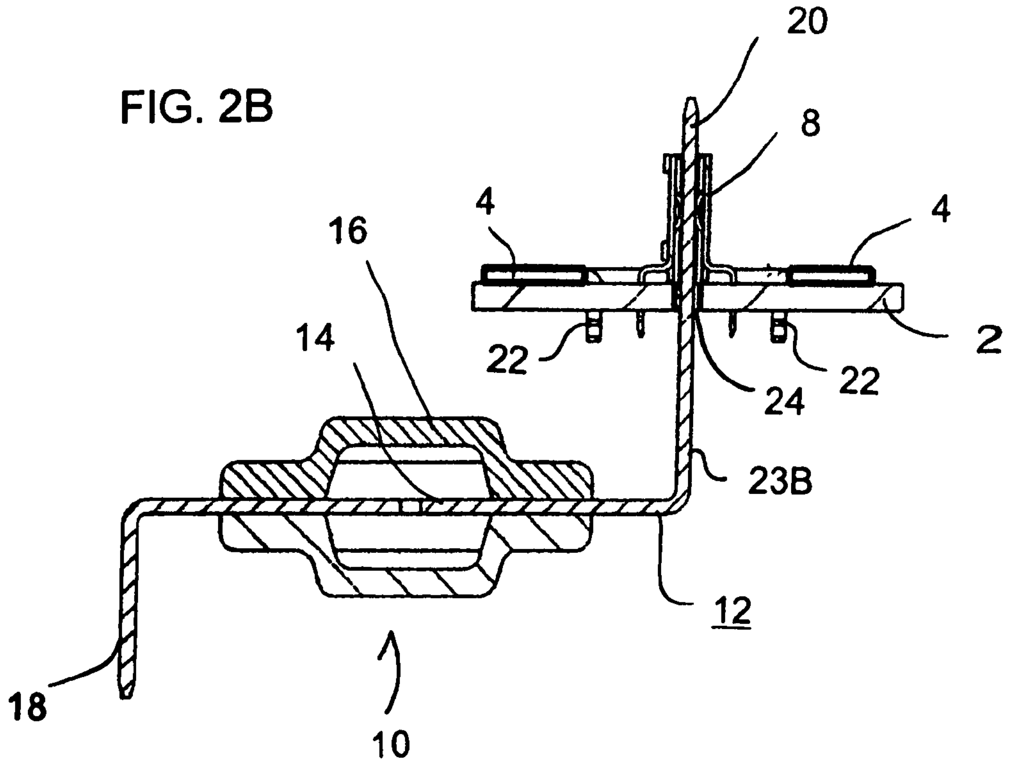
Figure 3A:
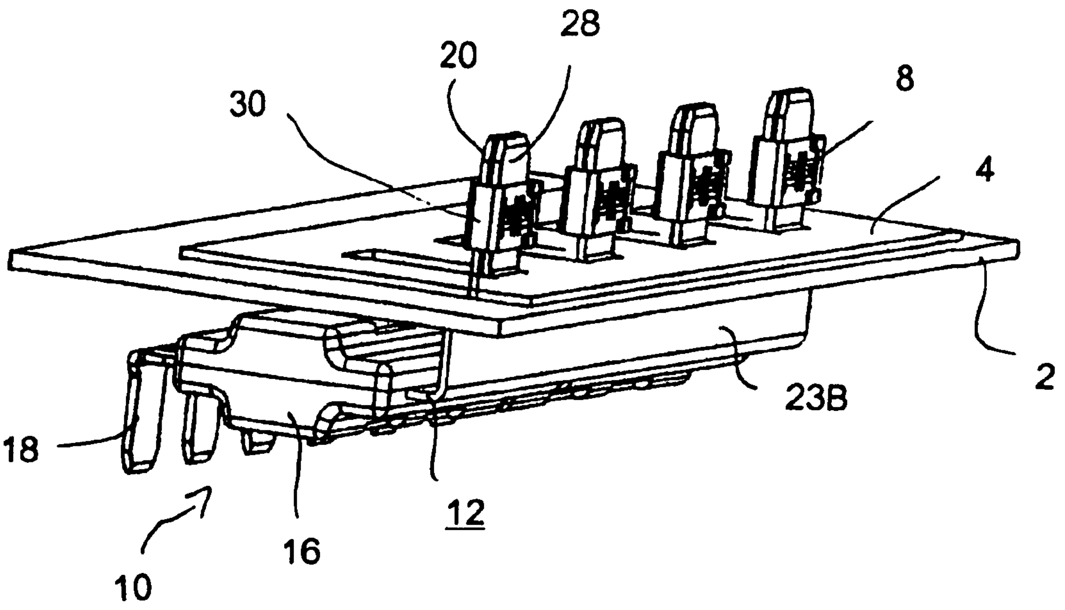
FIGS. 3A, 3B show a perspective illustration and a section illustration of a third design variant which is designed in a comparable manner to the second alternative and in which the feed plate has bent-up contact lugs.
Figure 3B:
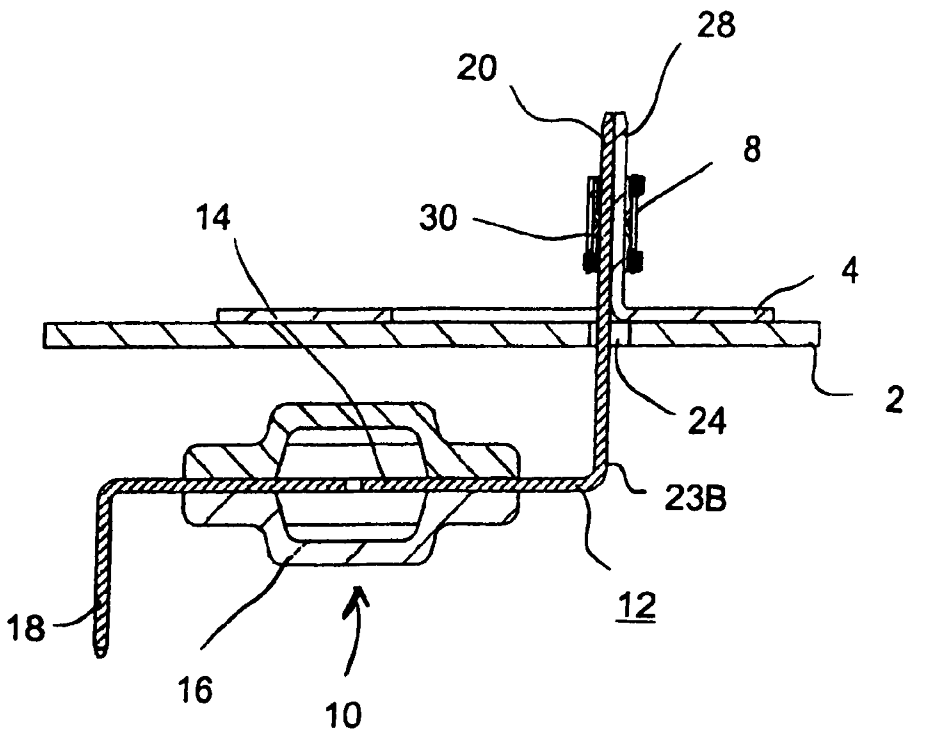

In contrast to the exemplary embodiments according to FIGS. 2A, 2B, the feed plate 4 in the exemplary embodiment according to FIGS. 3A, 3B has a plurality of bent-up contact lugs 28 which are provided for making contact with the input contact tongues 20. In order to form the plug-in contact elements 8, a surrounding contact spring 30 is pushed over the tongues 20 and lugs 28, with the result that the flat sides of the two parts 28, 20 are pressed against one another in such a way that contact is made. Therefore, no soldering is required for the plug-in contact elements 8 in this design variant. The contact lugs 28 are bent upward from the center of the feed plate 4 in a simple manner.

Figure 4A:
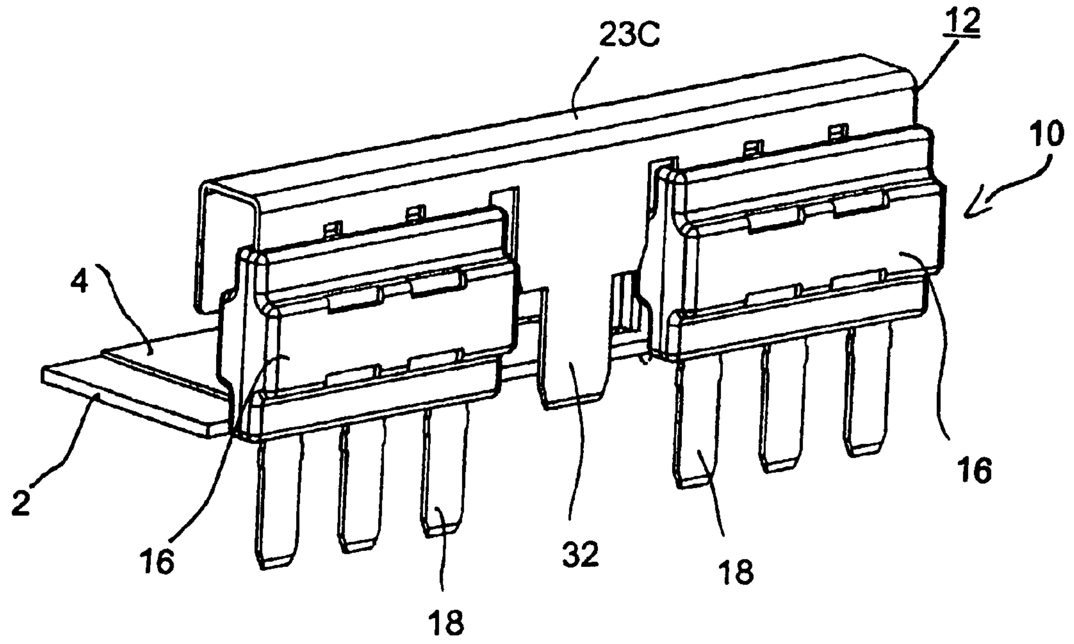
FIGS. 4A,4B,4C show perspective illustrations and a section illustration of a fourth alternative, in which a feed contact element is provided, by means of which power is fed both to the feed plate which is connected to the printed circuit board and also to the stamped grid of the multiple fuse arrangement.
Figure 4B:
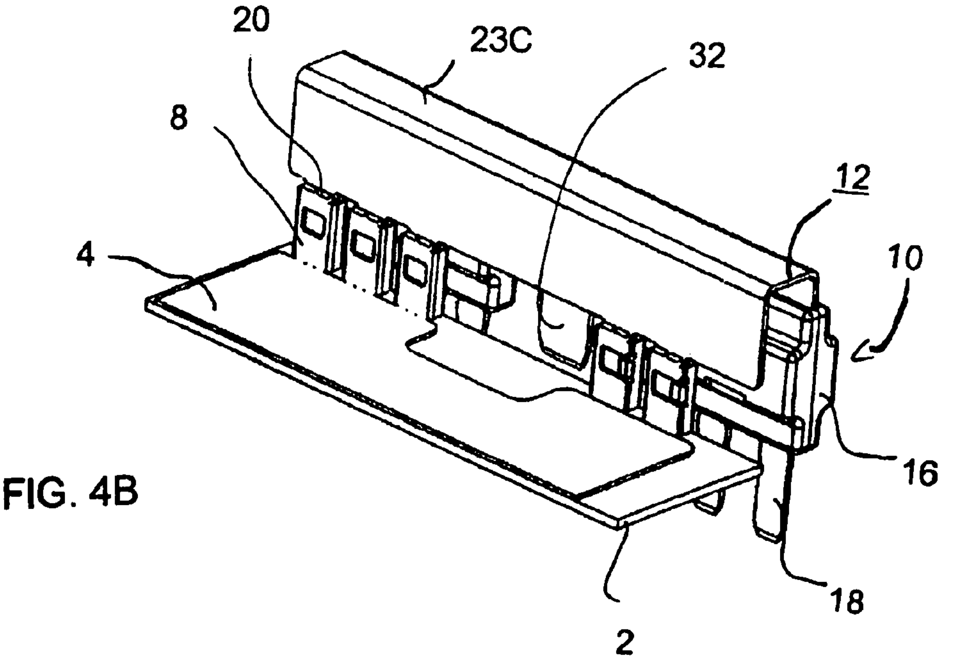
Figure 4C:
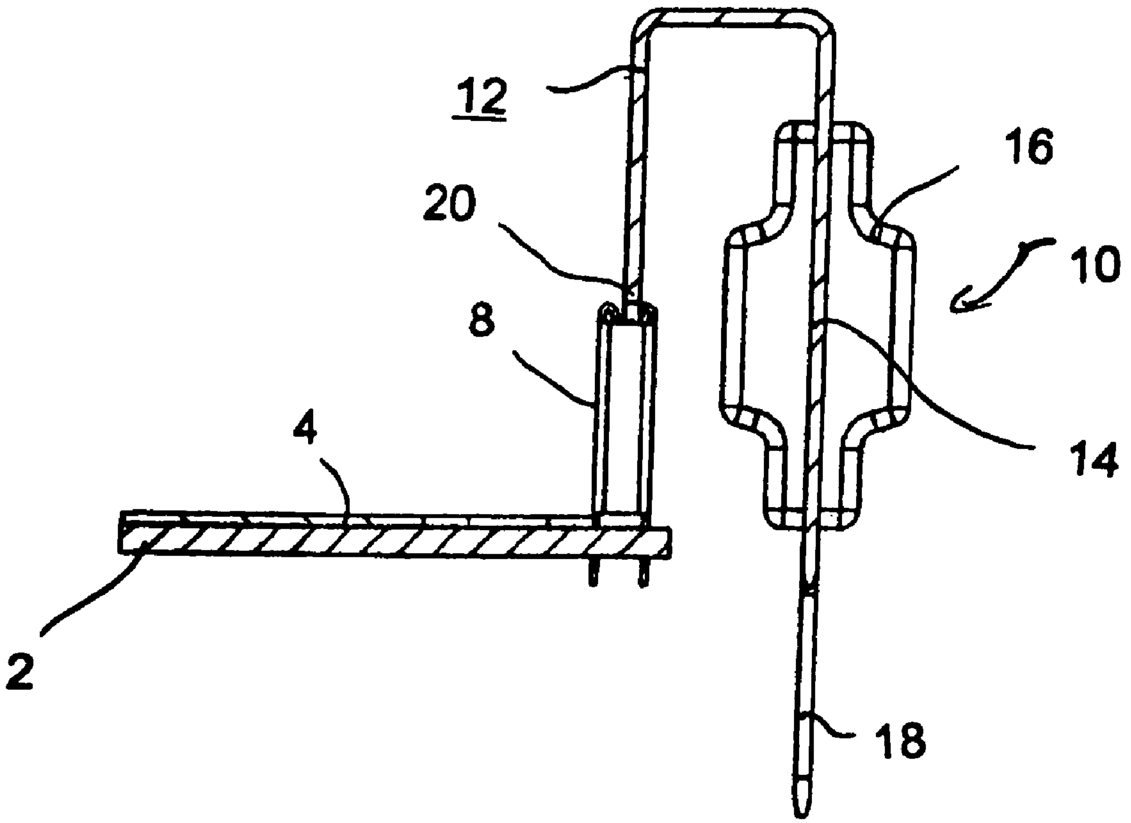

In the exemplary embodiment of FIGS. 4A, 4B, 4C, an additional feed contact tongue 32 to which the power supply line can be connected is provided as a substantial difference from the preceding exemplary embodiments. In this case, the feed contact tongue 32 is arranged on the same side as the output contact tongues 18 and is a section of the stamped grid 12. Since power is supplied by means of the feed contact tongue 32, said feed contact tongue has a greater width than the other output contact tongues 18. In the exemplary embodiment, the feed contact tongue 32 is arranged centrally and a plurality of output contact tongues 18 and in each case one fuse housing 16 are provided on either side.

Furthermore, in this exemplary embodiment, the connection from the feed plate 4 to the output contact tongues 18 is led past the side of the printed circuit board 2, with the result that the output contact tongues 18 are arranged opposite the feed plate 4 in this case too. The stamped grid 12 is again bent in a U-shape, with the result that the plug-in contact elements 18 and the fuse housing 16 are oriented above the printed circuit board 2 and perpendicular to said printed circuit board. The plug-in contact elements 8 are again in the form of solder contacts. The printed circuit board 2 itself or further high-power distributors, which are switched by means of relays arranged on the printed circuit board for example, is/are supplied with power by means of the feed plate 4 which in turn is supplied with power by means of the plug-in contact elements 8. The stamped grid 12 therefore has multiple functions in this exemplary embodiment. It firstly provides fuse protection for the outgoing output lines in the sense of a multiple fuse arrangement, ensures that power is distributed both to the output lines by means of the output contact tongues 18 and also to further high-power loads, ensures power is supplied to the printed circuit board 2 with the loads arranged thereon, and additionally permits connection to a power supply cable, for example a battery cable, via the feed contact tongue 32 by virtue of a simple plug-in contact-making means.

Figure 5A:
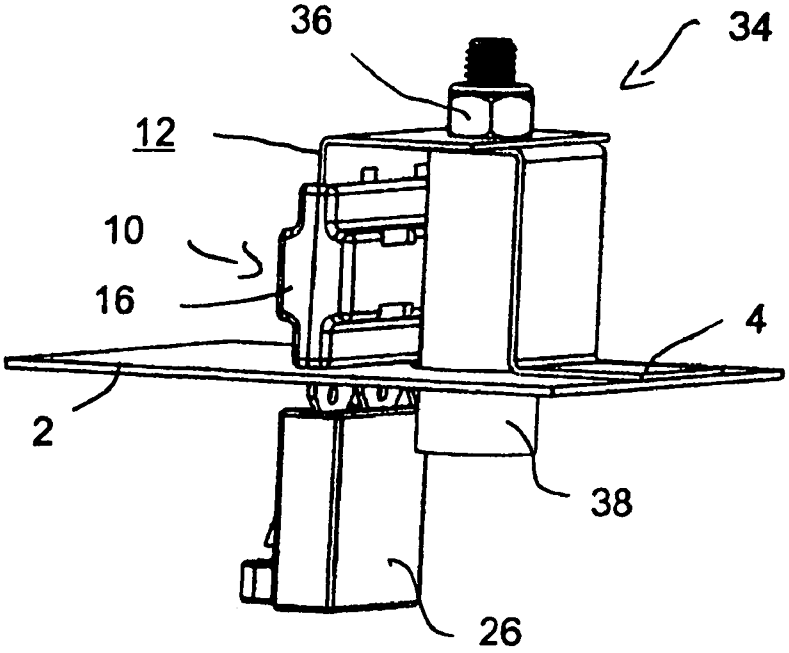
FIGS. 5A, 5B show a perspective illustration and a section illustration of a fifth design variant which is designed in a similar manner to the first design variant according to FIGS. 1A, 1B, but in which a screw contact is provided in place of the plug-in contact elements for the purpose of connecting the feed plate to the multiple fuse arrangement.
Figure 5B:
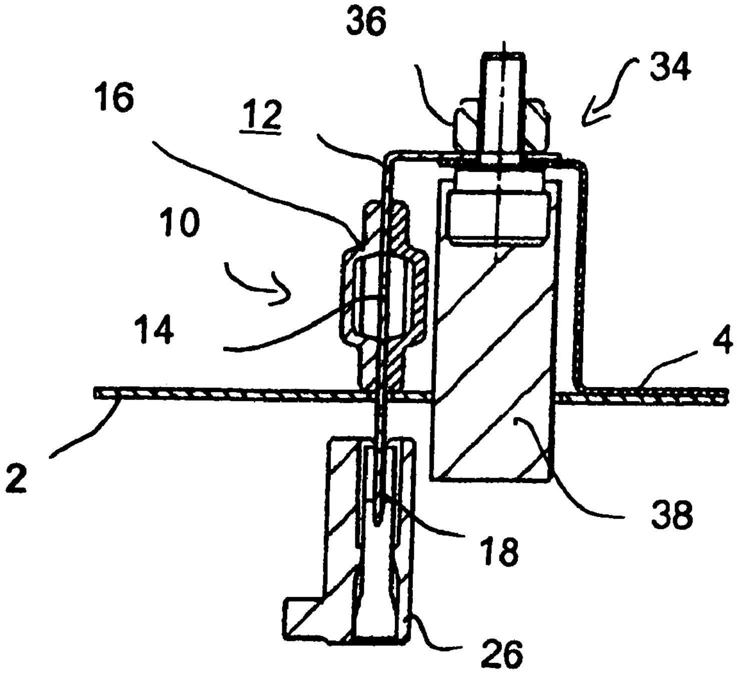

Finally, in the exemplary embodiment of FIGS. 5A, 5B, a screw contact 34 is provided in place of the plug-in contact elements 8 as a single contact element. To this end, the feed plate 4 is bent upward at the end and forms a step with an upper contact area. A corresponding contact area of the stamped grid 12 is braced against said contact area by means of a screw connection 36. In this case, the stamped grid 12 is likewise bent in the manner of an L, with the result that the fuse housing 16 is oriented perpendicular to the printed circuit board 2. The screw connection 36 is supported in a support body 38 which is composed of insulating material, in particular plastic, as a result of which high mechanical stability is achieved.

List of reference symbols

2 Printed circuit board
4 Feed plate
8 Plug-in contact element
10 Multiple fuse arrangement
12 Stamped grid
14 Fuse
16 Fuse housing
18 Output contact tongue
20 Input contact tongue
22 Lug
23 A,B,C Connecting element
24 Aperture

26 Output housing
28 Contact lug
30 Contact surrounding spring
32 Feed contact tongue
34 Screw contact
36 Screw connection
38 Support body

We claim:

1. An apparatus for power distribution, the apparatus comprising;

a printed circuit board having opposite sides;

a feed line disposed on one of said sides of said printed circuit board;

a plurality of output contacts disposed on the other of said sides of said printed circuit board opposite said feed line;

a multiple fuse arrangement includinq a plurality of fuses, said multiple fuse arrangement connecting said feed line to said plurality of output contacts;

a contact element connecting said feed line to said multiple fuse arrangement;

said multiple fuse arrangement including a stamped grid, each of said plurality of fuses being formed by individual grid webs of said stamped grid; and said stamped grid having an output end with output contact tongues forming said output contacts and an input end connected to said contact element for connecting said stamped grid to said feed line.

2. The apparatus according to claim 1, wherein said contact element includes at least one plug-in contact element conductively connected to said feed line.

3. The apparatus according to claim 2, wherein said feed line has a bent-up contact lug forming said at least one plug-in contact element.

4. The apparatus according to claim 2, which further comprises a connecting element connecting said fuses to said at least one plug-in contact element, said connecting element having a feed contact element for connecting a power supply line.

5. The apparatus according to claim 4, wherein said connecting element is a section of said stamped grid.

6. The apparatus according to claim 1, wherein said feed line has a bent-up contact lug forming said at least one plug-in contact element, and said input end of said stamped grid includes at least one input contact tongue plugged into said at least one plug-in contact element.

7. The apparatus according to claim 1, which further comprises a common fuse housing in which a plurality of said fuses of said multiple fuse arrangement are disposed.

8. The apparatus according to claim 7, wherein said fuse housing is oriented perpendicular to said printed circuit board and parallel to said at least one contact element, and a connecting element bent in a U-shape makes contact between said at least one contact element and said fuses.

9. The apparatus according to claim 7, wherein said fuse housing is disposed parallel to said printed circuit board and opposite to said feed line, and a connecting element bent in an L-shape and led through said printed circuit board connects said fuses to said at least one contact element.

10. The apparatus according to claim 1, wherein said feed line is a feed plate fitted on said printed circuit board.

11. The apparatus according to claim 1, wherein said printed circuit board has an aperture formed therein through which a connection of said feed line to said output contacts is led.

12. The apparatus according to claim 11, wherein said connection is led past a side of said printed circuit board.

13. The apparatus according to claim 1, which further comprises an output housing in which said output contacts are disposed.

* * * * *